United States Patent
Kikuchi et al.

(10) Patent No.: US 11,336,379 B2
(45) Date of Patent: May 17, 2022

(54) MOBILE TERMINAL TEST DEVICE AND MOBILE TERMINAL TEST METHOD

(71) Applicant: ANRITSU CORPORATION, Atsugi (JP)

(72) Inventors: Kengo Kikuchi, Atsugi (JP); Koji Fukazawa, Atsugi (JP); Yuichi Tsuiki, Atsugi (JP); Tsubasa Takahashi, Atsugi (JP); Takato Tokuyama, Atsugi (JP)

(73) Assignee: ANRITSU CORPORATION, Atsugi (JP)

( * ) Notice: Subject to any disclaimer, the term of this patent is extended or adjusted under 35 U.S.C. 154(b) by 18 days.

(21) Appl. No.: 17/145,551

(22) Filed: Jan. 11, 2021

(65) Prior Publication Data

US 2021/0234619 A1 Jul. 29, 2021

(30) Foreign Application Priority Data

Jan. 27, 2020 (JP) .............................. JP2020-011151

(51) Int. Cl.
*H04L 25/08* (2006.01)
*H04L 5/14* (2006.01)
*H04L 12/26* (2006.01)
*H04W 24/06* (2009.01)
*H04B 17/00* (2015.01)
*H03M 1/12* (2006.01)
*H04L 25/02* (2006.01)

(52) U.S. Cl.
CPC ............ *H04B 17/00* (2013.01); *H03M 1/124* (2013.01); *H04L 5/14* (2013.01); *H04L 25/02* (2013.01)

(58) Field of Classification Search
None
See application file for complete search history.

(56) References Cited

U.S. PATENT DOCUMENTS

| 9,413,570 B2 * | 8/2016 | Kikuchi | ............... H04L 25/085 |
| 2021/0399938 A1 * | 12/2021 | Morita | ............... H04L 27/2678 |
| 2022/0029777 A1 * | 1/2022 | Morita | ................. H04L 7/0016 |

FOREIGN PATENT DOCUMENTS

| JP | 2015142256 A | 8/2015 |
| JP | 5890852 B2 | 3/2016 |

* cited by examiner

*Primary Examiner* — Kenneth B Wells
(74) *Attorney, Agent, or Firm* — Greer Burns & Crain Ltd.

(57) ABSTRACT

A first shift unit (14) that shifts an amplitude value of the I baseband signal and an amplitude value of the Q baseband signal in a lower direction by the predetermined number of bits so that the predetermined number of lower bits thereof have a value after a decimal point, a first rounding unit (15) that rounds-to-even the amplitude value of the I baseband signal and the amplitude value of the Q baseband signal shifted by the first shift unit (14) with a rounding width of 1 in decimal notation, and a first averaging unit (16) that respectively calculates a time average of the amplitude value of the I baseband signal and the amplitude value of the Q baseband signal rounded by the first rounding unit (15) are included.

9 Claims, 14 Drawing Sheets

| True Value A | Rounded off Value B | Rounded off Error C (=B−A) | Rounded Value To Even Number D | Error in Rounding to Even Number E (=D−A) |
|---|---|---|---|---|
| −2.00 | −2 | 0 | −2 | 0 |
| −1.75 | −2 | −0.25 | −2 | −0.25 |
| −1.50 | −2 | −0.50 | −2 | −0.50 |
| −1.25 | −1 | +0.25 | −1 | +0.25 |
| −1.00 | −1 | 0 | −1 | 0 |
| −0.75 | −1 | −0.25 | −1 | −0.25 |
| −0.50 | −1 | −0.50 | 0 | +0.50 |
| −0.25 | 0 | +0.25 | 0 | +0.25 |
| 0.00 | 0 | 0 | 0 | 0 |
| +0.25 | 0 | −0.25 | 0 | −0.25 |
| +0.50 | +1 | +0.50 | 0 | −0.50 |
| +0.75 | +1 | +0.25 | +1 | +0.25 |
| +1.00 | +1 | 0 | +1 | 0 |
| +1.25 | +1 | −0.25 | +1 | −0.25 |
| +1.50 | +2 | +0.50 | +2 | +0.50 |
| +1.75 | +2 | +0.25 | +2 | +0.25 |
| +2.00 | +2 | 0 | +2 | 0 |

FIG.3

| True Value A | Rounded off Value B | Rounded off Error C (=B−A) |
|---|---|---|
| −2.00 | −2 | 0 |
| −1.75 | −2 | −0.25 |
| −1.50 | −2 | −0.50 |
| −1.25 | −1 | +0.25 |
| −1.00 | −1 | 0 |
| −0.75 | −1 | −0.25 |
| −0.50 | −1 | −0.50 |
| −0.25 | 0 | +0.25 |
| 0.00 | 0 | 0 |
| +0.25 | 0 | −0.25 |
| +0.50 | +1 | +0.50 |
| +0.75 | +1 | +0.25 |
| +1.00 | +1 | 0 |
| +1.25 | +1 | −0.25 |
| +1.50 | +2 | +0.50 |
| +1.75 | +2 | +0.25 |
| +2.00 | +2 | 0 |

FIG.11

MOBILE TERMINAL TEST DEVICE AND MOBILE TERMINAL TEST METHOD

CROSS-REFERENCE TO RELATED APPLICATIONS

This application claims Convention priority to Japanese Patent Application No. 2020-011151, filed Jan. 27, 2020, the entire contents of which are incorporated herein by reference.

FIELD OF THE INVENTION

The present invention relates to a mobile terminal test device and a mobile terminal test method, and more particularly to a mobile terminal test device and a mobile terminal test method that function as a pseudo base station for testing a mobile terminal.

BACKGROUND ART

Conventionally, a mobile terminal test device for communicating with a mobile terminal such as a mobile phone or a data communication terminal and testing whether or not the mobile terminal can communicate normally has been known (for example, Patent Document 1).

Such a mobile terminal test device is provided with a frequency conversion unit that converts the carrier frequency of the analog signal to be measured inputted from the mobile terminal into an intermediate frequency $f_{IF}$, an A/D converter that samples the signal to be measured and converts the signal into the digital data, and an orthogonal demodulator that orthogonal-demodulates the digital data converted by the A/D converter into an I baseband signal and a Q baseband signal. The analog measured signal that has passed through the frequency converter, the A/D converter, and the orthogonal demodulator becomes a digital I baseband signal and a digital Q baseband signal having a finite bit length.

FIGS. 10A and 10B show an example of a temporal change of the amplitude values of the I baseband signal and the Q baseband signal and the measurement example of a constellation. The signal to be measured is a CW (Continuous Wave) having a frequency of 1950 MHz, and the frequency of the CW after frequency conversion is 0 Hz. The sampling frequency Fs of the A/D converter is 737.28 MHz, and the number of samples plotted in FIG. 10A is 3072. In the example of FIG. 10A, the amplitude value of the I baseband signal is fixed as a positive value, and the amplitude value of the Q baseband signal is fixed as a negative value. Therefore, as shown in FIG. 10B, the constellation is plotted only in the fourth quadrant on the IQ plane.

When passing a finite bit length digital I, Q baseband signal outputted from a quadrature demodulator to a subsequent arithmetic block, the I, Q baseband signal is "rounded" to reduce logic. Processing to reduce the number of output bits from the orthogonal demodulator is required. For this reason, in the conventional mobile terminal test device, the I and Q baseband signals having a finite bit length are usually "rounding off". "Rounding off" gives a rule of how to round when the numerical value before rounding is 0.5, and is a method of rounding in a direction away from the numerical origin 0 according to the sign.

CITATION LIST

Patent Literature

Patent Document 1: Japanese Patent No. 5890852

SUMMARY OF THE INVENTION

Technical Problem

However, the "rounding off" performed in the conventional mobile terminal test device as disclosed in Patent Document 1 has the problems as described below.

FIG. 11 is a table showing a rounding error when rounding off is performed on a true value having 2 bits after the decimal point. When the time average value of the amplitude value is obtained from the measurement result of the I baseband signal whose positive value is confirmed as shown in FIG. 10A, the value before the rounding process is set as the true value A. For example, it can be understood that, if 0.25, 0.50, 0.75, 1.00, 1.25, 1.50, 1.75, 2.00 appear as true values A with equal frequency, only the rounding error +0.50 of the true value A whose first decimal place value is 5 is accumulated without being canceled out. On the other hand, it can be understood that, when obtaining the time average value of the amplitude values of the Q baseband signals with fixed negative values as shown in FIG. 10A, for example, if −0.25, −0.50, −0.75, −1.00, −1.25, −1.50, −1.75, −2.00 appear with equal frequency as true value A, only the rounding error −0.50 of the true value A whose first decimal place value is 5 is accumulated without being canceled out.

Therefore, the distribution of the rounding error of the amplitude values of the positive value fixed I baseband signal and the negative value fixed Q baseband signal as shown in the measurement example of FIG. 10A become non-uniform as is shown in the measurement example of FIG. 12. As a feature, for the I baseband signal, since the number of events with a rounding error of −0.5 is 0, cancellation with an event with a rounding error of +0.5 does not occur, and the process of calculating the average value is biased in the positive infinity direction. On the contrary, for the Q baseband signal, since the number of events with a rounding error of +0.5 is 0, the process of calculating the average value is biased in the negative infinity direction.

As described above, when the signs of the amplitude values obtained from the I baseband signal and the Q baseband signal are fixed, there is a problem that the measurement accuracy of these time average amplitude values deteriorates due to rounding.

The present invention has been made to solve such a conventional problem, and it is the object of the present invention to provide a mobile terminal test device and a mobile terminal test method capable of improving the measurement accuracy of these time average amplitude values with fixed sign obtained from the I baseband signal and the Q baseband signal, which are orthogonal to each other, compared with the case where the amplitude values with fixed sign obtained from the I baseband signal and the Q baseband signal, which are orthogonal to each other, are rounded off.

Means to Solve the Problem

In order to solve the above problems, the mobile terminal test device according to the present invention comprises: a frequency conversion unit that converts frequency of an analog signal to be measured; an A/D converter that samples the signal to be measured which has been converted frequency by the frequency conversion unit, and converts the sampled signal to be measured into a binary digital data having a predetermined number of bits; an orthogonal demodulator that orthogonal-demodulates the digital data outputted from the A/D converter and generates an I baseband signal and a Q baseband signal that are orthogonal to each other; a shift unit that shifts a numerical information of the I baseband signal and numerical information of the Q baseband signal in a lower direction by the predetermined number of bits so that the predetermined number of lower bits thereof have a value after a decimal point; a rounding unit that rounds-to-even the numerical information of the I baseband signal and the numerical information of the Q baseband signal shifted by the shift unit with a rounding width of 1 in decimal notation; and a first averaging unit that respectively calculates a time average of the numerical information of the I baseband signal and the numerical information of the Q baseband signal rounded by the first rounding unit. Further, the mobile terminal test device according to the present invention may further comprise the numerical information of the I baseband signal is an amplitude value of the I baseband signal, the numerical information of the Q baseband signal is an amplitude value of the Q baseband signal, the shift unit shifts the amplitude value of the I baseband signal and the amplitude value of the Q baseband signal in a lower direction by a predetermined number of bits so that the predetermined number of lower bits have a value after a decimal point.

By this configuration, the mobile terminal test device according to the present invention can improve the measurement accuracy of these time average amplitude values with fixed sign obtained from the I baseband signal and the Q baseband signal, which are orthogonal to each other, compared with the case where the amplitude values with fixed sign obtained from the I baseband signal and the Q baseband signal, which are orthogonal to each other, are rounded off.

Further, the mobile terminal test device according to the present invention may further comprise a first signal processing unit that, when the signal to be measured is a signal based on the time division duplex system, performs signal processing for extracting the time average values in the non-transmission time of the time division duplex system from among the time average values calculated by the averaging unit.

By this configuration, the mobile terminal test device according to the present invention can improve the amplitude measurement accuracy of the carrier leak in the non-transmission time of the signal to be measured based on the time division duplex system.

Further, the mobile terminal test device according to the present invention comprises: the signal to be measured is an analog modulation signal; the numerical information of the I baseband signal is an amplitude value of an I symbol data; the numerical information of the Q baseband signal is an amplitude value of a Q symbol data, the mobile terminal test device further comprises a constellation calculation unit that calculates an I symbol data and a Q symbol data for expressing the I baseband signal and the Q baseband signal as a constellation on an IQ plane, per each modulation symbol of the signal to be measured; a shift unit that shifts the amplitude values of the I symbol data and the Q symbol data corresponding to each of the modulation symbols on the constellation in lower direction by the predetermined number of bits so that the predetermined number of lower bits thereof have a value after a decimal point.

By this configuration, the mobile terminal test device according to the present invention can improve the measurement accuracy of the time average amplitude value of the amplitude value of these symbol data, compared with the case where the amplitude values with fixed sign of the I symbol data and the Q symbol data at each of the modulation symbols on the constellation.

In addition, the mobile terminal test device according to the present invention may further comprise: a normalization factor calculation unit that calculates a normalization factor for converting the amplitude value of the I symbol data and the amplitude value of the Q symbol data rounded by the rounding unit to measurement points on the constellation, using the time average value calculated by the second averaging unit; a normalization unit that calculates the measurement points on the constellation by normalizing the amplitude value of the I symbol data and the amplitude value of the Q symbol data rounded by the rounding unit, by the normalization factor calculated by the normalization factor calculation unit; and an EVM average value calculation unit that calculates an absolute value of an amplitude of an error vector between an ideal point on the constellation and a measurement point obtained by the normalization unit and calculates a time average value of the calculated amplitude absolute value.

By this configuration, the mobile terminal test device according to the present invention converts the rounded-to-even amplitude values of the I symbol data and Q symbol data into the measurement points normalized in accordance with the ideal points on the constellation, thereby making it possible to prevent deterioration due to rounding error, so that the EVM time average value can be calculated.

Further, the mobile terminal test method according to the present invention comprises: a frequency conversion step to convert frequency of an analog signal to be measured; an A/D conversion step to sample the signal to be measured which has been converted frequency by the frequency conversion step, and convert the sampled signal to be measured into a binary digital data having a predetermined number of bits; an orthogonal demodulation step to orthogonal-demodulate the digital data outputted from the A/D conversion step and generate an I baseband signal and a Q baseband signal that are orthogonal to each other; a shift step to shift an amplitude value of the I baseband signal and an amplitude value of the Q baseband signal in a lower direction by the predetermined number of bits so that the predetermined number of lower bits thereof have a value after a decimal point; a rounding step to round-to-even the amplitude value of the I baseband signal and the amplitude value of the Q baseband signal shifted by the first shift step with a rounding width of 1 in decimal notation; and an averaging step to respectively calculate a time average of the amplitude value of the I baseband signal and the amplitude value of the Q baseband signal rounded by the first rounding step. Further, the mobile terminal test method according to the present invention comprises: the numerical information of the I baseband signal is an amplitude value of the I baseband signal; the numerical information of the Q baseband signal is an amplitude value of the Q baseband signal.

By this configuration, the mobile terminal test method according to the present invention can improve the measurement accuracy of these time average amplitude values with fixed sign obtained from the I baseband signal and the Q baseband signal, which are orthogonal to each other, compared with the case where the amplitude values with fixed sign obtained from the I baseband signal and the Q baseband signal, which are orthogonal to each other, are rounded off.

Further, the mobile terminal test method according to the present invention comprises; a frequency conversion step to convert frequency of an analog signal to be measured; the signal to be measured is an analog modulation signal; the numerical information of the I baseband signal is an amplitude value of an I symbol data of the I baseband signal; the numerical information of the Q baseband signal is an amplitude value of a Q symbol data of the Q baseband signal; a constellation calculation step to calculate an I symbol data and a Q symbol data for expressing the I baseband signal and the Q baseband signal as a constellation on an IQ plane, per each modulation symbol of the signal to be measured.

By this configuration, the mobile terminal test method according to the present invention can improve the measurement accuracy of the time average amplitude value of the amplitude value of these symbol data, compared with the case where the amplitude values with fixed sign of the I symbol data and the Q symbol data at each of the modulation symbols on the constellation.

In addition, the mobile terminal test method according to the present invention may further comprise: a normalization factor calculation step to calculate a normalization factor for converting the amplitude value of the I symbol data and the amplitude value of the Q symbol data rounded by the second rounding step to measurement points on the constellation, using the time average value calculated by the second averaging step; a normalization step to calculate the measurement points on the constellation by normalizing the amplitude value of the I symbol data and the amplitude value of the Q symbol data rounded by the second rounding step, by the normalization factor calculated by the normalization factor calculation step; and an EVM average value calculation step to calculate an absolute value of an amplitude of an error vector between an ideal point on the constellation and a measurement point obtained by the normalization step and calculate a time average value of the absolute value.

By this configuration, the mobile terminal test method according to the present invention converts the rounded-to-even amplitude values of the I symbol data and Q symbol data into the measurement points normalized in accordance with the ideal points on the constellation, thereby making it possible to prevent deterioration due to rounding error, so that the EVM time average value can be calculated.

Effect of the Invention

The present invention provides a mobile terminal test device and a mobile terminal test method capable of improving the measurement accuracy of these time average amplitude values with fixed sign obtained from the I baseband signal and the Q baseband signal, which are orthogonal to each other, compared with the case where the amplitude values with fixed sign obtained from the I baseband signal and the Q baseband signal, which are orthogonal to each other, are rounded off.

BRIEF EXPLANATION OF THE DRAWINGS

FIG. 3 is a table showing the rounding error when rounding is performed on even numbers for true values with 2 bits after the decimal point.

FIG. 11 is a table showing the rounding error in the case that the true value with 2 bits after the decimal point was rounded off.

DETAILED DESCRIPTION OF EMBODIMENTS

Hereinafter, embodiments of the mobile terminal test device and the mobile terminal test method according to the present invention will be described with reference to the drawings.

First Embodiment

Figure 1:
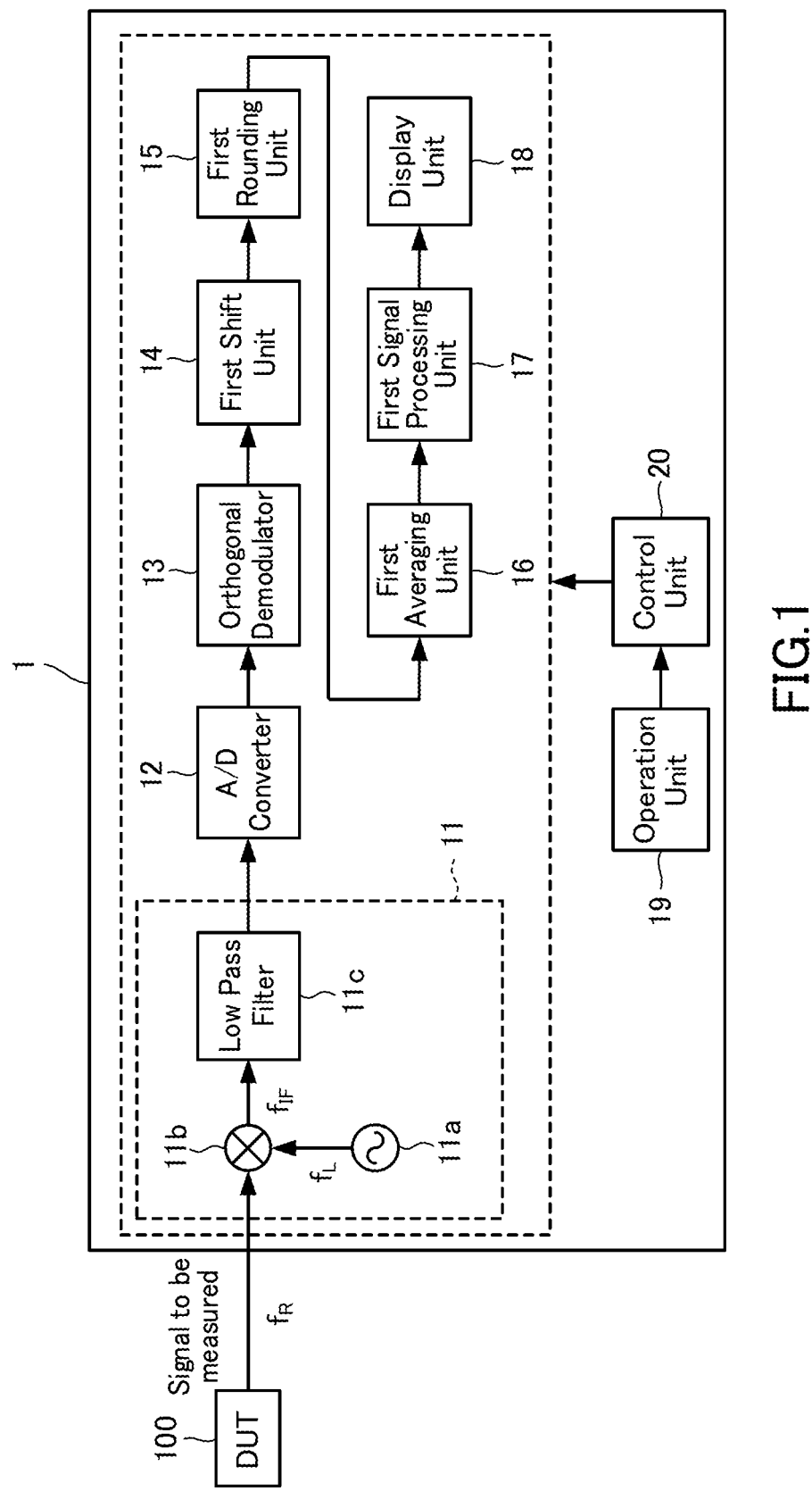
FIG. 1 is a block diagram showing a configuration of a mobile terminal test device according to the first embodiment of the present invention.

As shown in FIG. 1, the mobile terminal test device 1 according to the first embodiment of the present invention, functioning as a pseudo base station for testing the device under test (DUT) 100, is provided with a frequency converter 11, an A/D converter 12, an orthogonal demodulator 13, a first shift unit 14, a first rounding unit 15, a first averaging unit 16, a first signal processing unit 17, a display unit 18, an operation unit 19, and a control unit 20. The first shift unit 14 corresponds to a shift unit, the first rounding unit 15 corresponds to a rounding unit, and a first averaging unit 16 corresponds to an averaging unit.

The DUT 100 is, for example, a mobile terminal or a base station that has a wireless communication antenna and an RF circuit and can output an analog RF signal. Examples of a communication standard of DUT 100 include, for example, 5G NR, TD-LTE, FDD-LTE, LTE-Advanced, GSM (registered trademark), TD-SCDMA, W-CDMA (registered trademark), CDMA2000, Bluetooth (registered trademark) and the like. The DUT 100 and the frequency conversion unit 11 may be connected by wire with a coaxial cable or the like, or may be wirelessly connected via a wireless communication antenna.

The frequency conversion unit 11 converts frequency of an analog RF signal as a signal to be measured outputted from the DUT 100, and has a local signal generator 11a, a mixer 11b, and a low-pass filter 11c.

The local signal generator 11a is configured by, for example, a PLL circuit, and outputs a sine wave, having a frequency $f_L$ higher or lower than the original frequency fR value of the signal to be measured by the value of the conversion destination frequency, to the mixer 11b as a local signal.

The mixer 11b mixes the signal to be measured of the frequency $f_R$ and the local signal of the frequency $f_L$ outputted from the local signal generator 11a, and generates an output signal of the sum component or difference component of the frequencies of the two signals, which is an intermediate frequency signal of an intermediate frequency signal of ($|f_L-f_R|$ or $f_L+f_R$). This means that the mixer 11b is adapted to perform frequency conversion by mixing the signal to be measured with the local signal.

The low-pass filter 11c is extracts the intermediate frequency signal of the difference component from among the output signals of the mixer 11b. The cutoff frequency (high cutoff frequency) of the low-pass filter 11c includes the intermediate frequency $f_{IF}$ ($|f_L-f_R|$).

The A/D converter 12 samples the signal to be measured, which has been converted the frequency by the frequency conversion unit 11, at a predetermined sampling frequency $F_s$, and converts it into binary digital data having a predetermined number of bits.

The orthogonal demodulator 13 orthogonally demodulates the digital data outputted from the A/D converter 12 and generates an I baseband signal and a Q baseband signal that are orthogonal to each other.

The first shift unit 14 shifts an amplitude value Ia of the I baseband signal outputted from the orthogonal demodulator 13 and an amplitude value Qa of the Q baseband signal outputted from the orthogonal demodulator 13 in a lower direction by the predetermined number of bits so that the predetermined number of lower bits thereof have a value after a decimal point.

Hereinafter, the operation of the first shift unit 14 will be described by taking as an example a process of reducing the number of bits of the amplitude values Ia and Qa of the I baseband signal and the Q baseband signal outputted from the orthogonal demodulator 13 by 2 bits.

Figure 2:
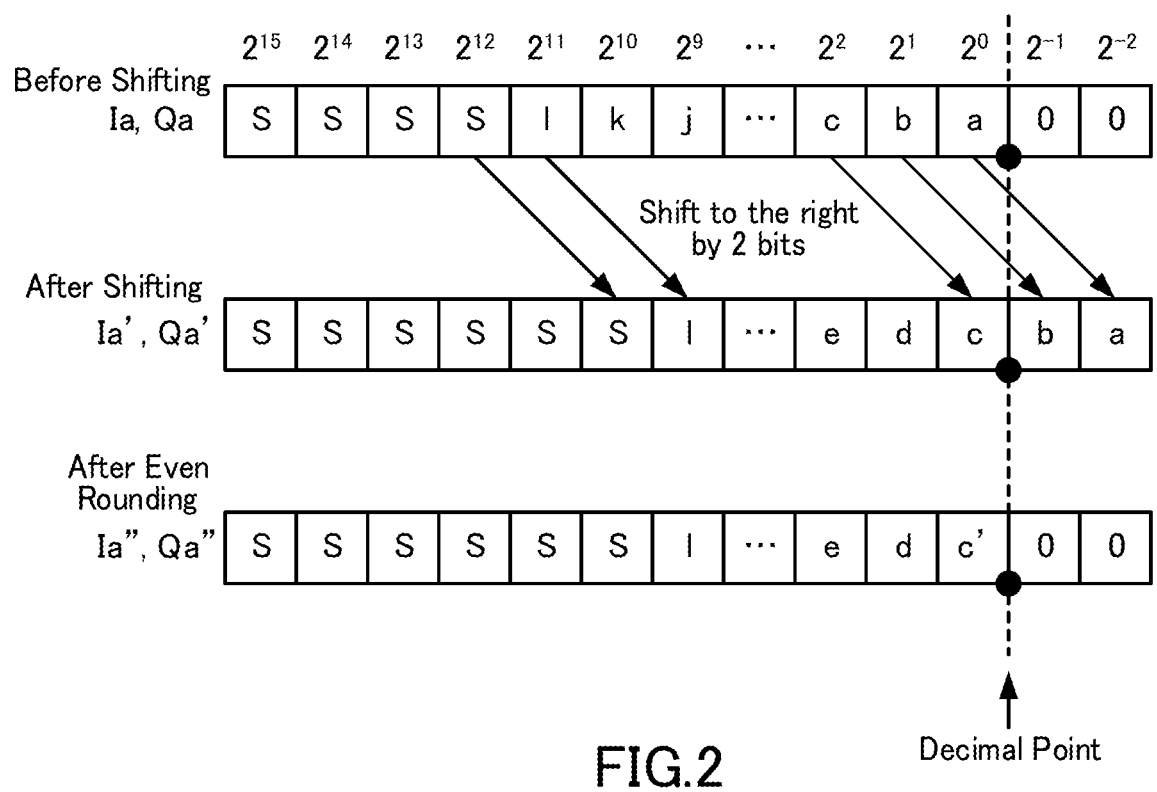
FIG. 2 is an explanatory diagram of an operation of a first shift unit and a first rounding unit included in the mobile terminal test device according to the first embodiment of the present invention.

In the example of FIG. 2, in the amplitude values Ia and Qa before shifting outputted from the orthogonal demodulator 13, the digits of $2^{15}$ to $2^{12}$ are sign bits S, and the digits of $2^{11\ to\ 20}$ include 16-bits digital data of absolute values. The first shift unit 14 shifts the 16-bits amplitude values Ia and Qa outputted from the orthogonal demodulator 13 in the lower direction (right direction) by 2 bits. In the new amplitude values Ia' and Qa' generated by this shift, the bits b and a of the $2^1$ and $2^0$ digits of the original amplitude values Ia and Qa constitute the digits of $2^{-1}$ and $2^{-2}$ after the decimal point.

The first rounding unit 15 rounds-to-even the amplitude value Ia' of the I baseband signal and the amplitude value Qa' of the Q baseband signal shifted by the first shift unit 14 with a rounding width of 1 in decimal notation. This means that "rounding-to-even" in the example of FIG. 2 means to round the integer value of the above amplitude values Ia' and Qa' to the nearest even number in the case that the values after the decimal point of the above amplitude values Ia' and Qa' are exactly 0.50 in decimal notation. By the rounding process for the amplitude values Ia' and Qa' by the first rounding unit 15, the amplitude values Ia'' and Qa'' in which the absolute values are included in the digits of $2^9$ to $2^0$ are generated. This means that the number of bits of the digital data outputted from the orthogonal demodulator 13 has been reduced by 2 bits.

FIG. 3 is a table summarizing the rounding error when rounding off and rounding-to-even are performed on true values having 2 bits after the decimal point. It can be understood that rounding-to-even cancels out all rounding errors if, for example, 0.25, 0.50, 0.75, 1.00, 1.25, 1.50, 1.75, 2.00 as the true value A before rounding process appear at equal frequencies, when obtaining the time average value of the amplitude value of the I baseband signal whose positive value is confirmed as shown in the measurement example of FIG. 10A. Similarly, it can be understood that rounding-to-even cancels out all rounding errors if, for example, −0.25, −0.50, −0.75, −1.00, −1.25, −1.50, −1.75, −2.00 appear at equal frequencies, when obtaining the time average value of the amplitude value of the Q baseband signal with a fixed negative value as the true value A before the rounding process as shown in the measurement example of FIG. 10A. The amplitude value of the I baseband signal is one of examples of the numerical information of the I baseband signal, and the amplitude value of the Q baseband signal is one of examples of the numerical information of the Q baseband signal.

Thus, when following even rounding, the rounding error is canceled out when a plurality of true values A having a decimal point of 0.50 appear at an equal frequency of those whose integer values are even and odd. As for the actual I baseband signal or Q baseband signal, since the thermal noise generated by the analog circuit such as the frequency converter 11 is added to the signal to be measured, it can be expected that the amplitude values Ia' and Qa' whose integer values are even and the amplitude values Ia' and Qa' whose integer values are odd appear at equal frequencies.

The number of bits shifted by the first shift unit 14 is not limited to 2 bits as described above, and may be any number of bits. For example, when the number of bits shifted by the first shift unit 14 is 1, the amplitude values Ia' and Qa' whose decimal point is 0.5 are rounded to an even number by the first rounding unit 15, with the result that the number of bits of the original amplitude values Ia and Qa is reduced by one bit. Further, when the number of bits shifted by the first shift unit 14 is 3, the amplitude values Ia' and Qa' having values after the decimal point 0.125, 0.250, 0.375, 0.500, 0.625, 0.750, 0.875 are rounded-to-even by the first rounding unit 15, with the result that the number of bits of the original amplitude values Ia and Qa is reduced by 3 bits.

The first averaging unit 16 calculates the time average values of the amplitude value Ia'' of the I baseband signal rounded by the first rounding unit 15 and the amplitude value Qa'' of the Q baseband signal, respectively.

Figure 10A:
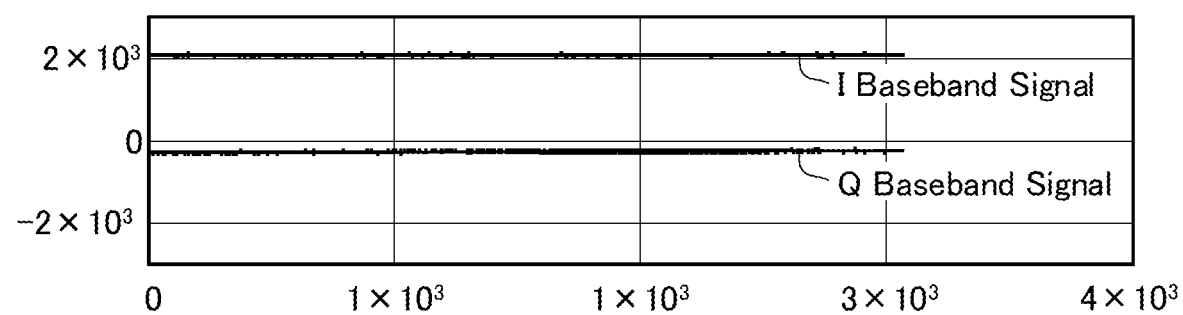
FIG. 10A is a graph showing a measurement example of the time change of the amplitude values of the I baseband signal and the Q baseband signal.
Figure 10B:
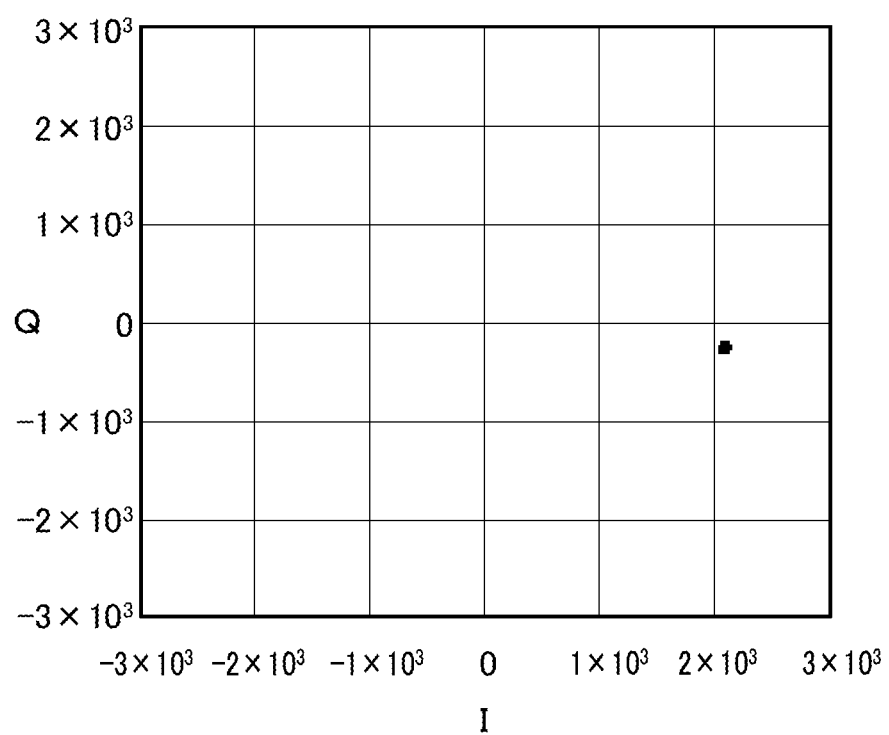
FIG. 10B is a graph showing a measurement example of the constellation obtained from an I baseband signal and a Q baseband signal.
Figure 12A:
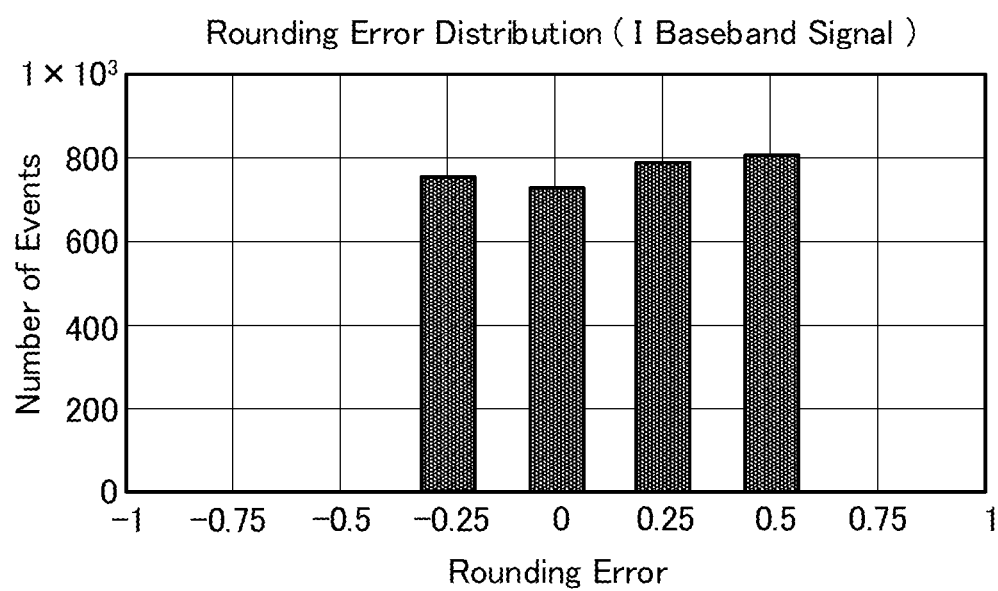
FIGS. 12A and 12B are histograms showing a distribution of rounding errors in the measurement examples of the amplitude value of an I baseband signal with fixed positive value and Q baseband signal with fixed negative value, respectively.
Figure 12B:
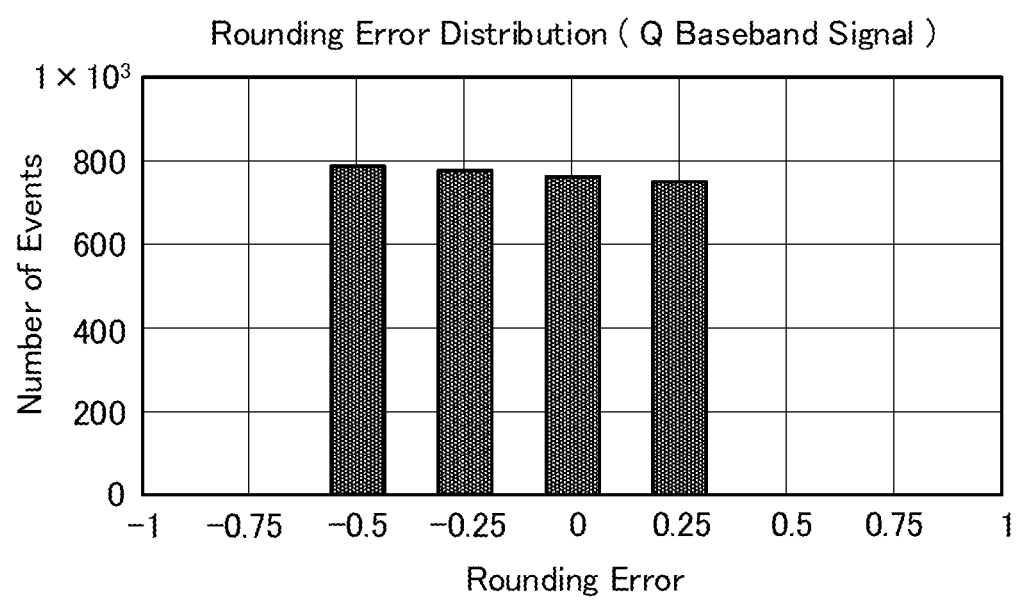

FIG. 10A shows a temporal change of the amplitude values Ia and Qa of the I baseband signal and the Q baseband signal obtained from the measured signal corresponding to −24 dBFS when the orthogonal demodulator 13 outputs 16-bit digital data. The time average value I_AVE of the amplitude value Ia is 2078.5107, and the time average value Q_AVE of the amplitude value Qa is −264.4268. Further, the time average amplitude value AMP_AVE of the signal to be measured corresponding to this −24 dBFS is 2095.2633 from the following equation (1).

[Equation 1]

$$AMP\_AVE = \sqrt{I\_AVE^2 + Q\_AVE^2} \quad (1)$$

On the other hand, the time average value I_AVE of the amplitude value Ia of the I baseband signal of the signal to be measured corresponding to −64 dBFS, which is 40 dB lower than −24 dBFS, is 16.2783, and the time average value Q_AVE of the amplitude value Qa of the Q baseband signal is 12.9583. Further, the time average amplitude value AMP_AVE of the signal to be measured corresponding to this −68 dBFS is 20.8063 from the equation (1).

Therefore, the relative power level of the time average amplitude value at −64 dBFS with respect to the time average amplitude value at −24 dBFS is −40.0609 dB as shown in the following equation (2). Further, the linearity error of the relative power level with respect to −40 dB is −0.0609 dB.

[Equation 2]

$$20\log\left(\frac{20.8063}{2095.2633}\right) = -40.0609 (\text{dB}) \quad (2)$$

Hereinafter, the case in which rounding off is performed as conventionally after the 16-bit I baseband signal and Q baseband signal output from the orthogonal demodulator 13 are shifted in the lower direction by 2 bits, will be described.

The time average value I_AVE of the amplitude value Ia' of the I baseband signal of the signal to be measured, which is output from the orthogonal demodulator 13 at −24 dBFS and is shifted in the lower direction by 2 bits by the first shift unit 14, is 519.7614, and the time average value Q_AVE of the amplitude value Qa' of the Q baseband signal is −66.2367. Further, the time average amplitude value AMP_AVE of the signal to be measured after this shift is 523.9648 from the equation (1).

On the other hand, the time average value I_AVE of the amplitude value Ia' of the I baseband signal of the signal to be measured, which is outputted from the orthogonal demodulator 13 at the level of −64 dBFS, which is 40 dB lower than −24 dBFS, and is shifted in the lower direction by 2 bits by the first shift unit 14, is 4.1787, and the time average value Q_AVE of the amplitude value Qa' of the Q baseband signal is 3.3542. Further, the time average amplitude value AMP_AVE of the signal to be measured after this shift is 5.3584 according to the equation (1).

Therefore, the relative power level of the time average amplitude value at −64 dBFS with respect to the time average amplitude value at −24 dBFS is −39.8053 dB as shown in the following equation (3). Furthermore, it can be understood that the linearity error of the relative power level with respect to −40 dB is 0.1947 dB, which is worse than −0.0609 dB obtained from the I baseband signal and the Q baseband signal before the shift.

[Equation 3]

$$20\log\left(\frac{5.3584}{523.9648}\right) = -39.8053 (\text{dB}) \quad (3)$$

Figure 4:
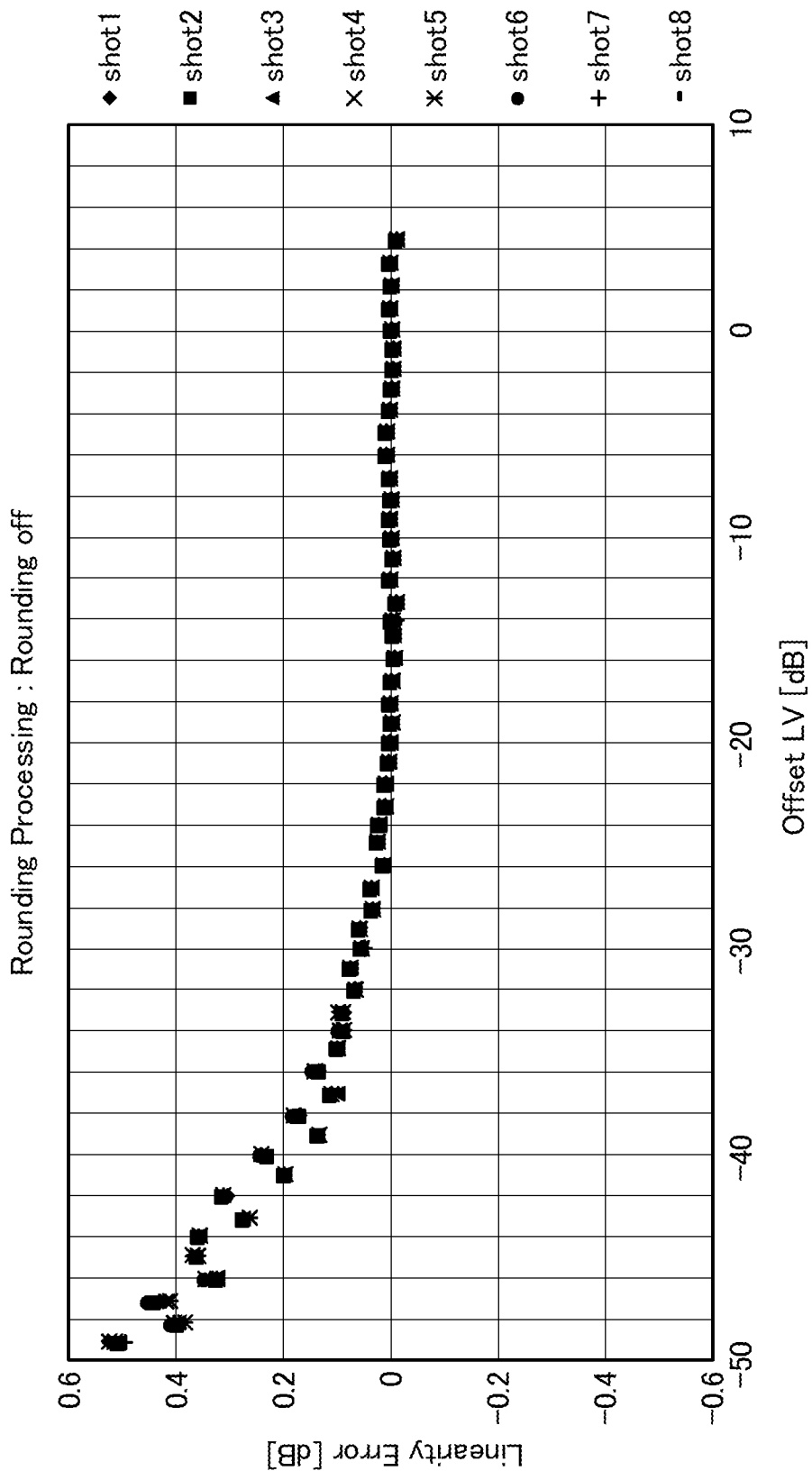
FIG. 4 is a graph showing the linearity error of rounded and rounded CW.

FIG. 4 is a graph that shows the linearity error of CW at various input levels, which was rounded down after being shifted downward by 2 bits by the first shift unit 14, with reference to the input level (−24 dBFS) (0 dB). As can be confirmed from the results of a plurality of measurements shown in FIG. 4, a linearity error of about 0.2 dB occurs at an input level equivalent to −40 dB (−64 dBFS) with respect to the reference (0 dB).

Figure 5:
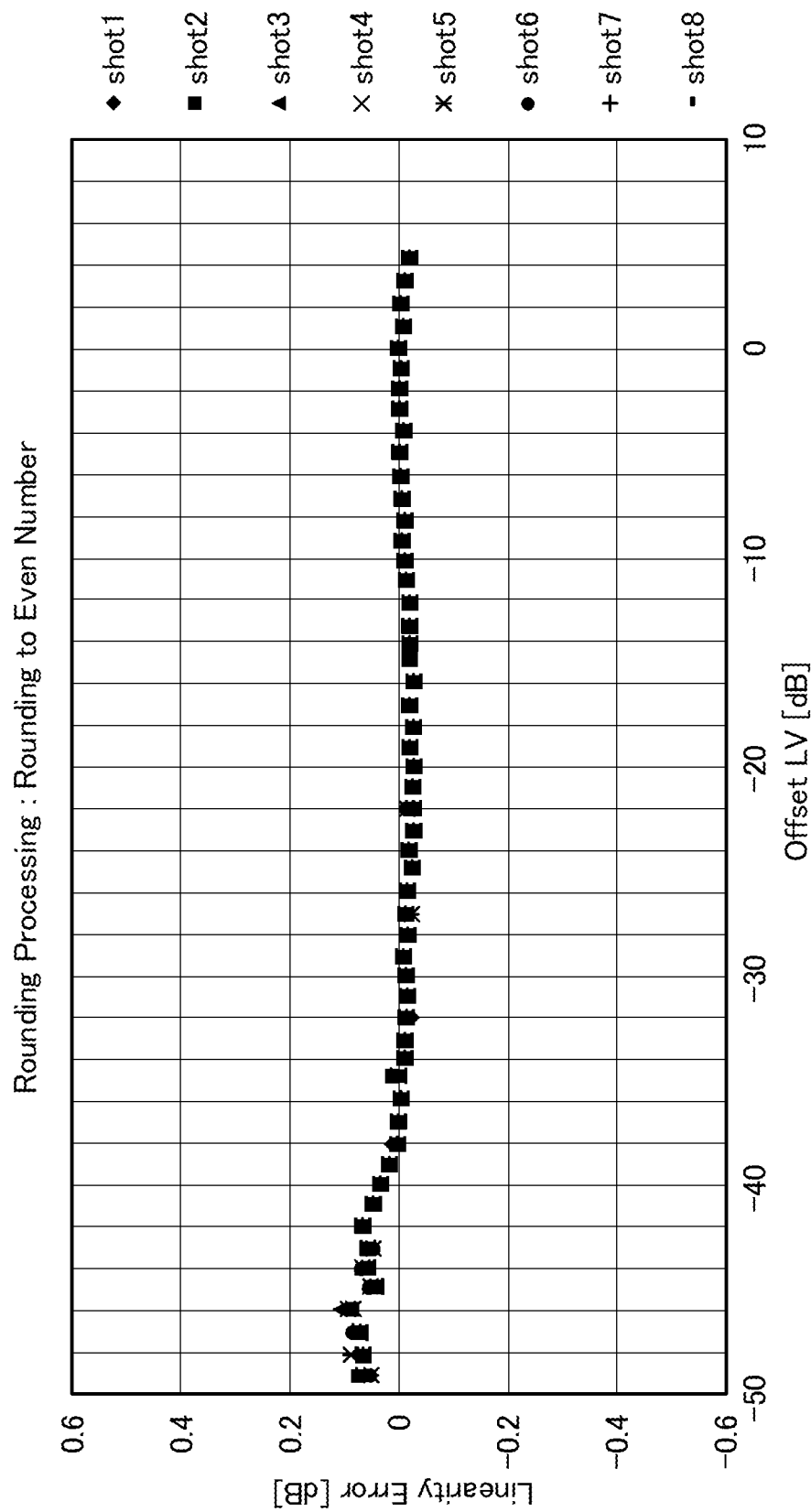
FIG. 5 is a graph showing the linearity error of rounded-to-even CW.

FIG. 5 is a graph that shows the linearity error of the CW of various input levels, which was rounded-to-even by the first rounding unit 15 after being shifted downward by 2 bits by the first shift unit 14, with the input level (−24 dBFS) as a reference (0 dB). As can be confirmed from the results of the multiple measurements shown in FIG. 5, the linearity error is about 0.05 dB even at an input level of −40 dB with respect to the reference (0 dB), which is compared with the result of rounding in FIG. 4. Thus, it can be understood that the linearity error is greatly improved.

From the above, it can be understood that the mobile terminal test device 1 of the present embodiment can measure time average amplitude value with high measurement accuracy, by respectively calculating the time average value of the amplitude value Ia" of the I baseband signal and the amplitude value Qa" of the Q baseband signal, rounded-to-even by the first rounding unit 15, by the first averaging unit 16 respectively. When the DUT 100 conforms to the Time Division Duplex (TDD) system, a minute CW signal such as a carrier leak may be transmitted at a non-transmission time according to a standard such as 3GPP. In particular, when the RF transmission frequency of the DUT 100 and the RF reception frequency of the frequency conversion unit 11 are equal, the carrier leak is detected as an amplitude value (constant amplitude+noise) in which the positive and negative signs are fixed in the digital baseband.

When the signal to be measured is a signal based on the TDD method, the first signal processing unit 17 shown in FIG. 1 extracts the time average value in the non-transmission time of the TDD method among the time average values calculated by the first averaging unit 16. Thus, the first signal processing unit 17 can measure the carrier leak value of the signal to be measured output from the DUT 100.

Further, the first signal processing unit 17 may generate, for example, time-series data or spectrum indicating a time change such as the amplitude (power) of the signal to be measured, and may measure channel power (CHP), occupied bandwidth (OBW), adjacent channel leakage, the power ratio (ACLR), burst average power, modulation accuracy (EVM), SNR (Signal to Noise Ratio), and the like.

The display unit 18 is constituted by a display device such as an LCD or a CRT, and displays a measurement result of a carrier leak value by the first signal processing unit 17. Further, the display unit 18 displays operation targets such as buttons, soft keys, pull-down menus, and text boxes for setting measurement conditions and the like according to the control signal output from the control unit 20.

The operation unit 19, which is for receiving an operation input by the user, is constituted by, for example, a touch panel provided on the display unit 18. Alternatively, the operating unit 19 may be configured to include an input device such as a keyboard or mouse. Further, the operation unit 19 may be configured by an external control device that performs remote control by a remote command or the like. The operation input to the operation unit 19 is detected by the control unit 20. For example, the operation unit 19 allows the user to specify the shift amount by the first shift unit 14.

The control unit 20 is constituted by, for example, a microcomputer or a personal computer including a CPU, ROM, RAM, HDD, and the like, and controls the operation of each of the above units constituting the mobile terminal test device 1. Further, in the control unit 20, at least a part of the first shift unit 14, the first rounding unit 15, the first averaging unit 16, and the first signal processing unit 17 can be configured by software by transferring a predetermined program stored in the ROM or the like to the RAM and executing the program. At least a part of the first shift unit 14, the first rounding unit 15, the first averaging unit 16, and the first signal processing unit 17 can be configured by a digital circuit such as an FPGA (Field Programmable Gate Array) or an ASIC (Application Specific Integrated Circuit), and the like. Alternatively, at least a part of the first shift unit 14, the first rounding unit 15, the first averaging unit 16, and the first signal processing unit 17 may be configured in an appropriate combination of the hardware processing by the digital circuit and software processing by the predetermined programs.

Figure 6:
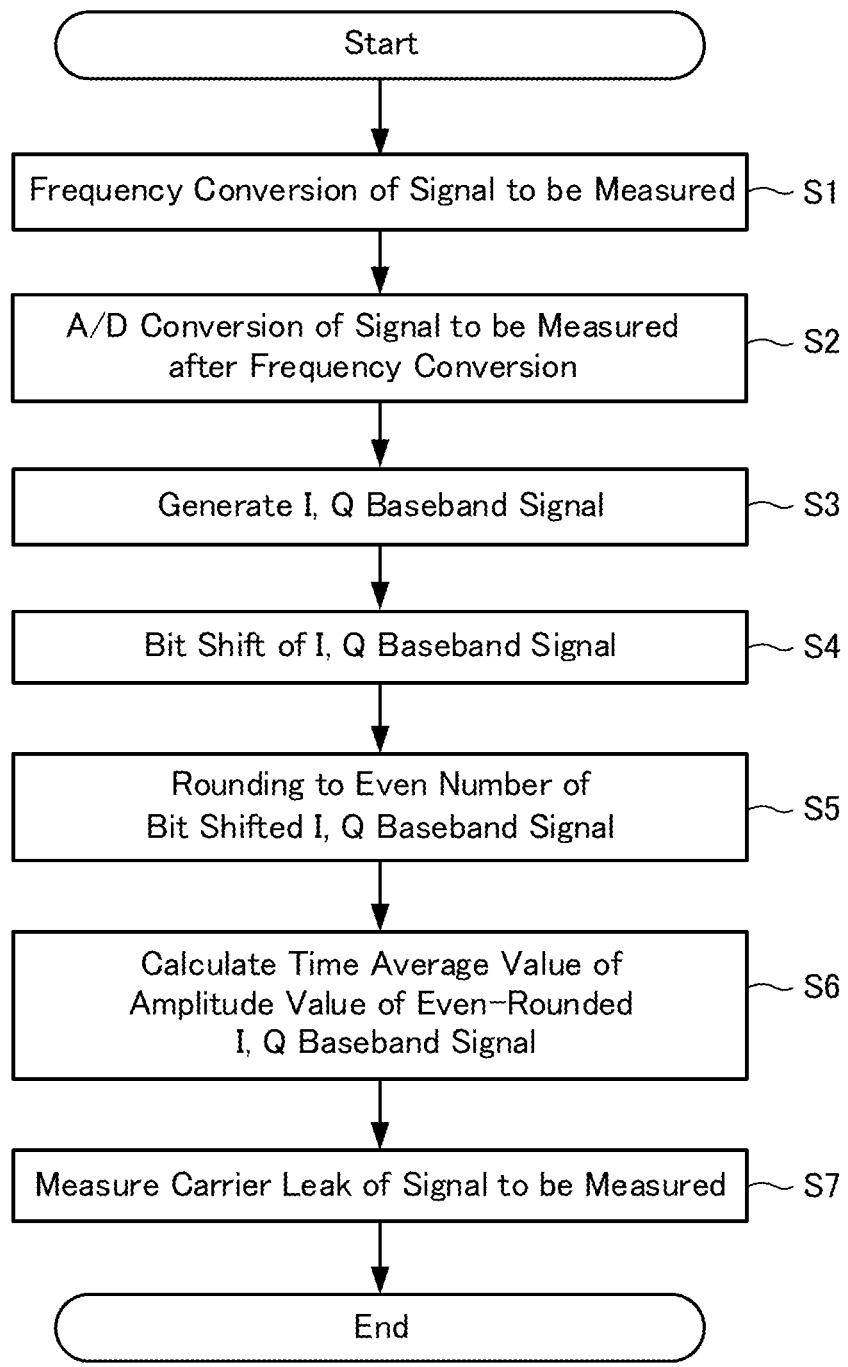
FIG. 6 is a flowchart for explaining a process of the mobile terminal test method using the mobile terminal test device according to the first embodiment of the present invention.

Hereinafter, a mobile terminal test method using the mobile terminal test device 1 of the present embodiment will be described with reference to the flowchart of FIG. 6. Here, it is assumed that the signal to be measured is a signal based on the TDD method.

First, the frequency conversion unit 11 converts the frequency of the analog signal to be measured of the frequency $f_R$ to a predetermined intermediate frequency $f_{IR}$ by using the local signal of the frequency $f_L$ (frequency conversion step S1).

Next, the A/D converter 12 samples the signal to be measured whose frequency is converted in step S1 at the sampling frequency $F_s$ and converts it into binary digital data having a predetermined number of bits (A/D conversion step S2).

Next, the orthogonal demodulator 13 orthogonally demodulates the digital data outputted from step S2 to generate an I baseband signal and a Q baseband signal that are orthogonal to each other (orthogonal demodulation step S3).

Next, the first shift unit 14 shifts an amplitude value Ia of the I baseband signal and an amplitude value Qa of the Q baseband signal in a lower direction by the predetermined number of bits so that the predetermined number of lower bits thereof have a value after a decimal point (first shift step S4).

Next, the first rounding unit 15 rounds-to-even the amplitude value Ia' of the I baseband signal and the amplitude value Qa' of the Q baseband signal shifted by the step S4 with a rounding width of 1 in decimal notation (first rounding process step S5).

Next, the first averaging unit 16 respectively calculates a time average of the amplitude value Ia" of the I baseband signal and the amplitude value Qa" of the Q baseband signal rounded by the step S5. (first average processing step S6).

Next, the first signal processing unit 17 measures the carrier leak value of the signal to be measured by extracting the time average value in the non-transmission time of the TDD method from among the time average values calculated by the step S6. (Step S7).

As described above, in the mobile terminal test device 1 according to the present embodiment, rounds-to-even with the rounding width in decimal notation as 1, after shifting the amplitude value of the I baseband signal and the amplitude value of the Q baseband signal in the lower direction by a predetermined number of bits. Further, the mobile terminal test device 1 calculates the time average value of the amplitude value of the even-rounded amplitude value of the I baseband signal and the even-rounded amplitude value of the Q baseband signal, respectively. Thus, the mobile terminal test device 1 can improve the measurement accuracy of these time average amplitude values with fixed sign obtained from the I baseband signal and the Q baseband signal, which are orthogonal to each other, compared with the case where the amplitude values with fixed sign obtained from the I baseband signal and the Q baseband signal, which are orthogonal to each other, are rounded off.

Further, the mobile terminal test device 1 according to the present embodiment extracts the time average value in the non-transmission time of the time division duplex system from the time average values obtained as described above, thereby improving the amplitude measurement accuracy of the carrier leak in the non-transmission time of the signal to be measured based on the TDD system.

Second Embodiment

Subsequently, the mobile terminal test device and the mobile terminal test method according to the second embodiment of the present invention will be described with reference to the drawings. The same components as those in the first embodiment are designated by the same reference numerals, and the description thereof will be omitted as appropriate. Further, description of the same operation as that of the first embodiment will be omitted as appropriate.

Figure 7:
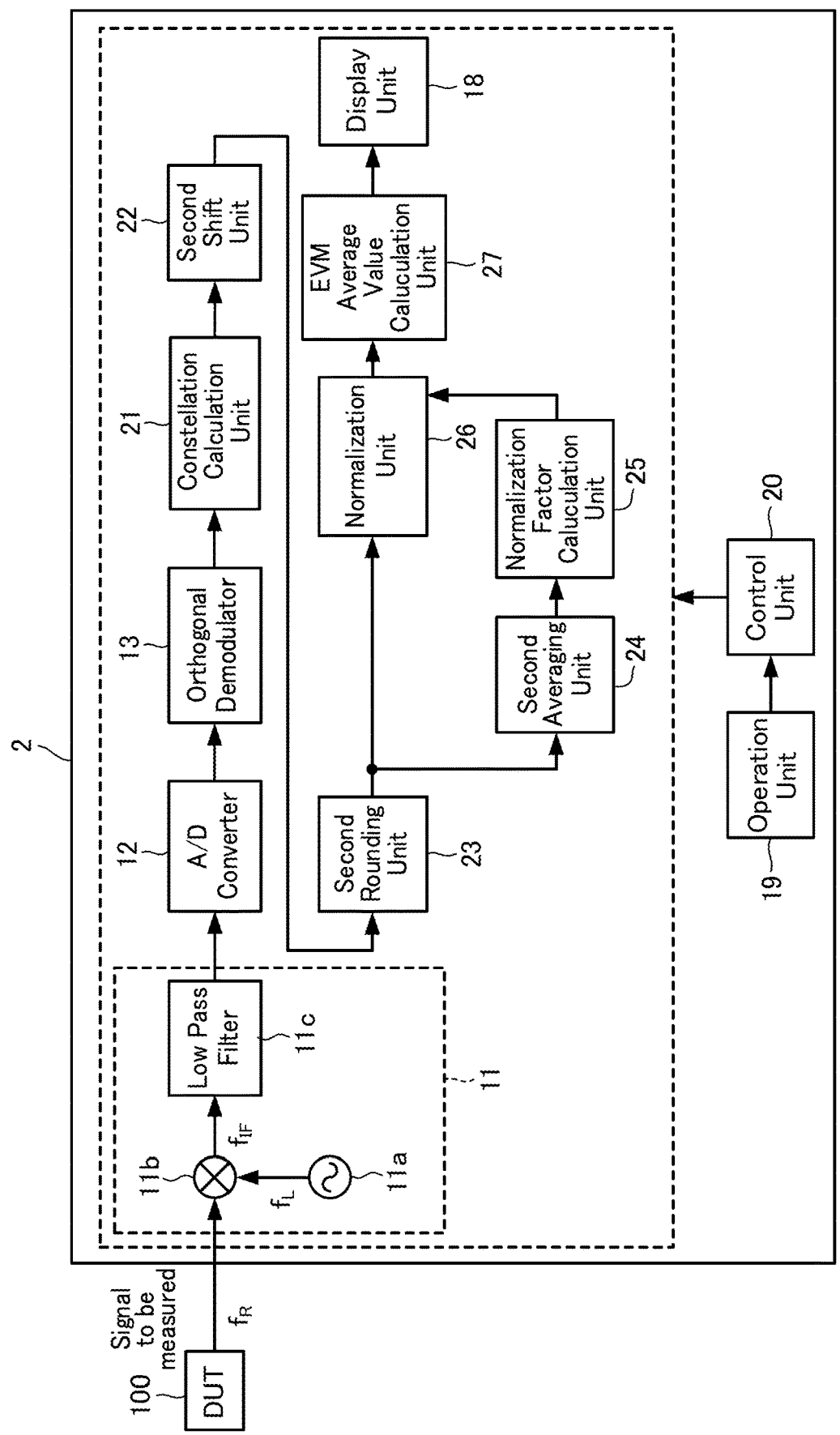
FIG. 7 is a block diagram showing a configuration of the mobile terminal test device according to a second embodiment of the present invention.

As shown in FIG. 7, the mobile terminal test device 2 of the present embodiment, functioning as a pseudo base station for testing the DUT 100, is provided with the frequency converter 11, the A/D converter 12, the orthogonal demodulator 13, a constellation calculation unit 21, a second shift unit 22, a second rounding unit 23, a second averaging unit 24, a normalization factor calculation unit 25, a normalization unit 26, an EVM average value calculation unit 27, the display unit 18, the operation unit 19, and the control unit 20. In the present embodiment, the signal to be measured output from the DUT 100 is a modulation signal modulated by a multi-level modulation method such as BPSK, QPSK, 16QAM, 64QAM, 256QAM, and the like. The second shift unit 22 corresponds to a shift unit, the second rounding unit 23 corresponds to a rounding unit, and a first averaging unit 24 corresponds to an averaging unit.

The constellation calculation unit 21 calculates the I symbol data and the Q symbol data for expressing the I baseband signal and the Q baseband signal output from the orthogonal demodulator 13 as a constellation on the IQ plane for each modulation symbol of the signal to be measured outputted from the DUT 100. In calculating the constellation, the constellation calculation unit 21 corrects the amplitude property and the phase property of the I baseband signal and the Q baseband signal so that the I symbol data and the Q symbol data for each modulation symbol are located in a specific quadrant on the IQ plane (that is, so that the sign is fixed).

The second shift unit 22 shifts the amplitude value of the I symbol data and the amplitude value of the Q symbol data corresponding to each modulation symbol on the constellation calculated by the constellation calculation unit 21 in the lower direction by the predetermined number of bits so that the predetermined number of lower bits thereof have a value after a decimal point. The operation of the second shift unit 22 is the same as the operation of the first shift unit 14 except that the shift target is different.

The second rounding unit 23 rounds-to-even the amplitude value of the I symbol data and the amplitude value of the Q symbol data shifted by the second shift unit 22 with the rounding width in decimal notation as 1. The operation of the second rounding unit 23 is the same as the operation of the first rounding unit 15 except that the rounding target is different. The amplitude value of the I symbol data is one of examples of the numerical information of the I baseband signal, and the amplitude value of the Q symbol data is one of examples of the numerical information of the Q baseband signal.

The second averaging unit 24 calculates the time average value of the amplitude value of the I symbol data and the amplitude value of the Q symbol data rounded by the second rounding unit 23, respectively.

The normalization factor calculation unit 25 calculates the normalization factor for converting the amplitude value of the I symbol data and the amplitude value of the Q symbol data rounded by the second rounding unit 23 to the measurement point on the constellation using the time average value calculated by the second averaging unit 24. For example, the normalization factor calculation unit 25 calculates a normalization factor that converts the sum of the powers of all the measurement points on the constellation into 1.

Figure 8:
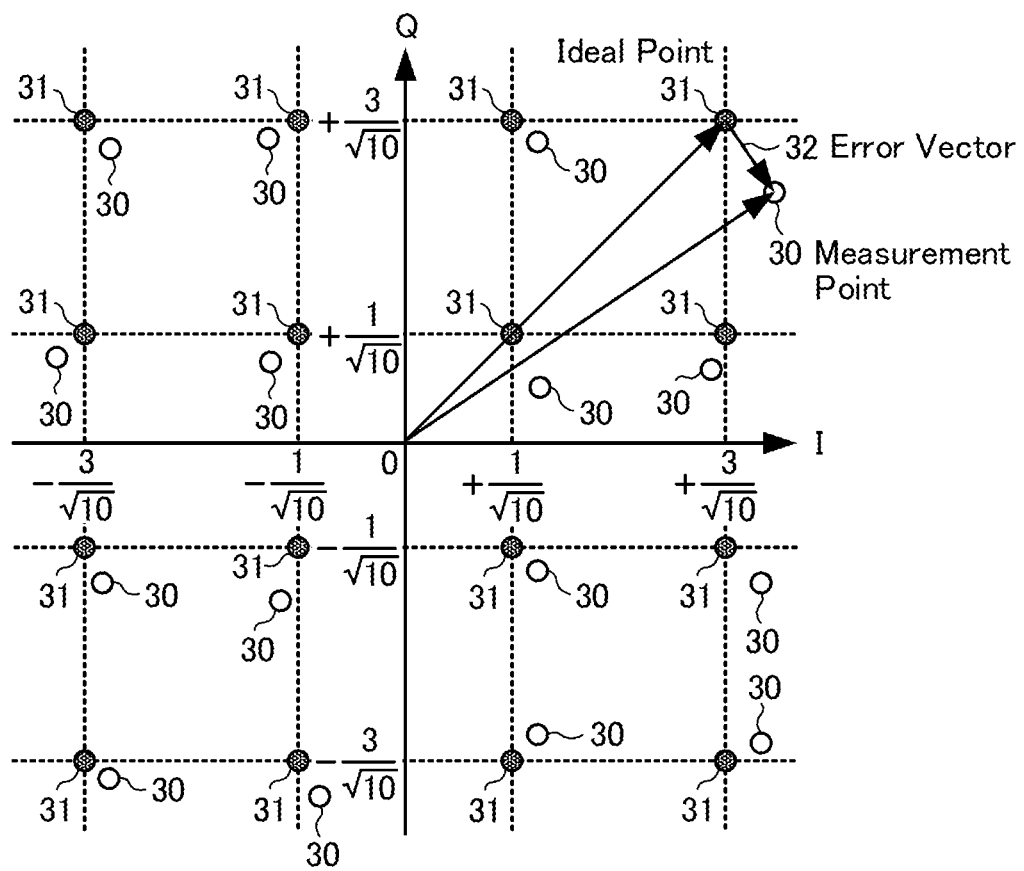
FIG. 8 is a figure showing an ideal normalized constellation of the signal under test modulated by 16QAM.

The normalization unit 26 calculates the measurement point 30 on the constellation by normalizing the amplitude value of the I symbol data and the amplitude value of the Q symbol data rounded by the second rounding unit 23 with the normalization factor calculated by the normalization factor calculation unit 25. FIG. 8 shows a normalized constellation when the modulation method of the signal under test is 16QAM. The white circles in the figure indicate the measurement points 30 normalized by the normalization unit 26. And, the black circles in the figure indicate the ideal points 31 of the I symbol data and the Q symbol data of each modulation symbol in which EVM is 0%. Although FIG. 8 shows only one measurement point 30 corresponding to each modulation symbol, there are actually a plurality of measurement points 30 corresponding to each modulation symbol.

The EVM average value calculation unit 27 calculates the absolute amplitude value of the error vector 32 between the ideal point 31 on the constellation and the measurement point 30 obtained by the normalization unit 26, and calculates the time average value (EVM time average value) of the calculated absolute amplitude value. The position of the ideal point 31 on the constellation is stored in the control unit 20 in advance for each multi-value modulation method, and the information on the position of the ideal point 31 according to the multi-value modulation method of the signal to be measured is inputted from the control unit 20 to the EVM average value calculation unit 27.

The display unit 18 displays the average value of the constellation calculated by the second averaging unit 24, the measurement result of the EVM time average value calculated by the EVM average value calculation unit 27, and the like.

At least a part of the constellation calculation unit 21, the second shift unit 22, the second rounding unit 23, the second averaging unit 24, the normalization factor calculation unit 25, the normalization unit 26, and the EVM average value calculation unit 27 may be constituted by software, may be constituted by a digital circuit such as FPGA or ASIC, or may be constituted by appropriately combining hardware processing by a digital circuit and software processing by a predetermined program.

Figure 9:
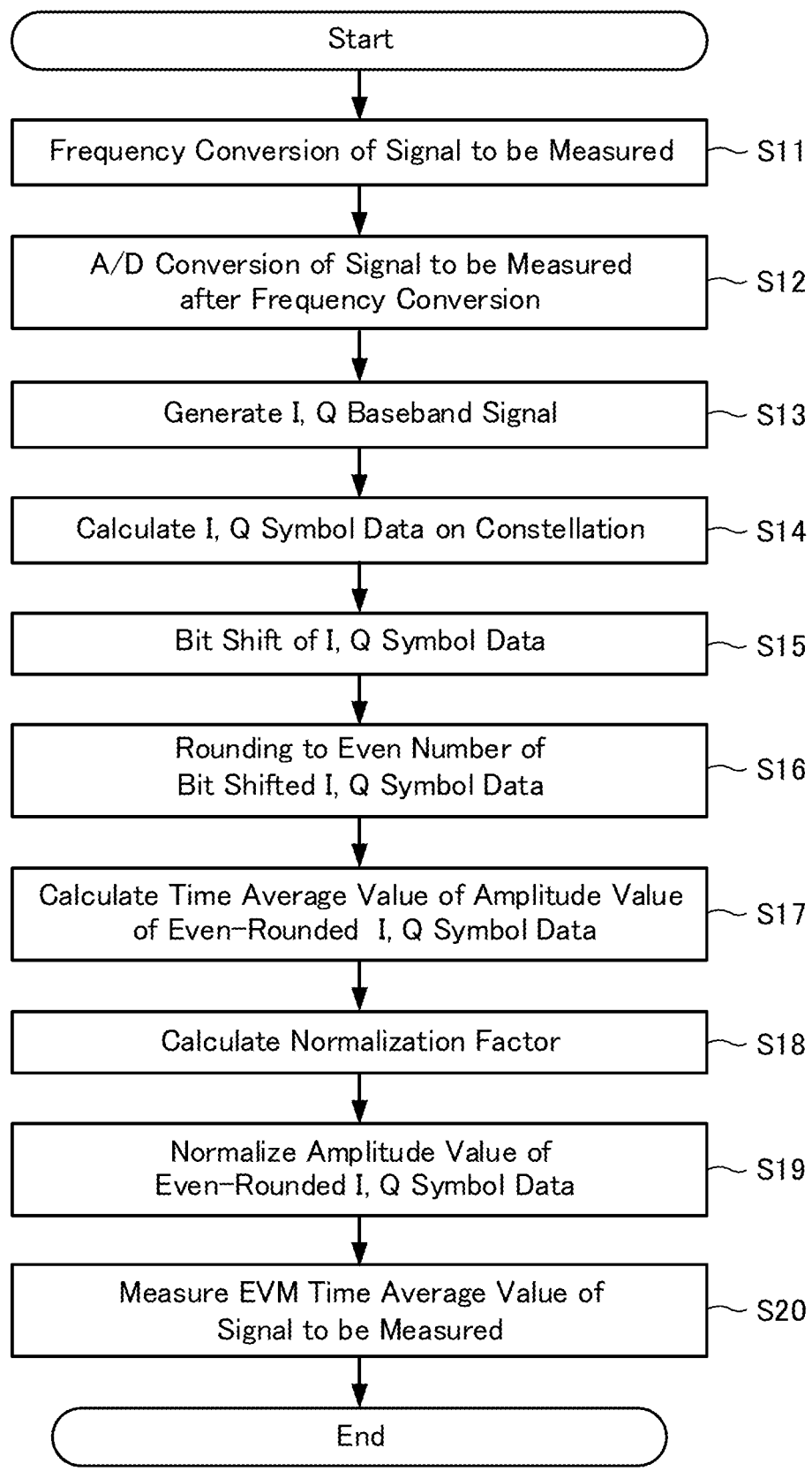
FIG. 9 is a flowchart for explaining a process of the mobile terminal test method using the mobile terminal test device according to the second embodiment of the present invention.

Hereinafter, a mobile terminal test method using the mobile terminal test device 2 of the present embodiment will be described with reference to the flowchart of FIG. 9.

First, the frequency conversion unit 11 frequency-converts the analog measured signal of the frequency $f_R$ to a predetermined intermediate frequency $f_{IF}$ by using the local signal of the frequency $f_L$ (frequency conversion step S11).

Next, the A/D converter 12 samples the signal to be measured whose frequency is converted in step S11 at the sampling frequency $F_s$, and converts it into binary digital data having a predetermined number of bits (A/D conversion step S12).

Next, the orthogonal demodulator 13 orthogonally demodulates the digital data output from step S12, and generates the I baseband signal and the Q baseband signal that are orthogonal to each other (orthogonal demodulation step S13).

Next, the constellation calculation unit 21 calculates the I symbol data and the Q symbol data for expressing the I baseband signal and the Q baseband signal as a constellation on the IQ plane for each modulation symbol of the signal to be measured (constellation calculation step S14).

Next, the second shift unit 22 shifts the amplitude value of the I symbol data and the amplitude value of the Q symbol data corresponding to each modulation symbol on the constellation, downward by the predetermined number of bits, so that the predetermined number of lower bits thereof have a value after a decimal point (second shift step S15).

Next, the second rounding unit 23 rounds-to-even the amplitude value of the I symbol data and the amplitude value of the Q symbol data shifted in step S15 with the rounding width in decimal notation as 1. (second rounding step S16). By the process of this step S16, in step S20 described later, the EVM time average value can be calculated more accurately than the rounding off method.

Next, the second averaging unit 24 calculates the time average value of the amplitude value of the I symbol data and the amplitude value of the Q symbol data rounded in step S16, respectively (second average processing step S17).

Next, the normalization factor calculation unit 25 calculates the normalization factor for converting the amplitude value of the I symbol data and the amplitude value of the Q symbol data rounded in the step S16, using the time average value calculated in step S17, to the measurement point 30 on the constellation (normalization factor calculation step S18).

Next, the normalization unit 26 calculates the measurement point 30 on the constellation by normalizing the amplitude value of the I symbol data and the amplitude value of the Q symbol data rounded in step S16 with the normalization factor calculated in the step S18 (normalization processing step S19).

Next, the EVM mean value calculation unit 27 calculates the absolute amplitude value of the error vector 32 between the ideal point 31 on the constellation and the measurement point 30 obtained in step S19, and calculates the EVM time average value of the calculated amplitude absolute value (EVM average value calculation step S20).

As described above, the mobile terminal test device 2 according to the present embodiment shifts the amplitude values of the I symbol data and the Q symbol data to be represented as a constellation on the IQ plane downward by a predetermined number of bits, and rounds-to-even with a rounding width of 1 in decimal notation. Further, the mobile terminal test device 2 calculates the time average value of the amplitude values of the even-rounded I symbol data and the Q symbol data, respectively. Thus, the mobile terminal test device 2 can improve the measurement accuracy of these time average amplitude values with fixed sign obtained from the I baseband signal and the Q baseband signal, which are orthogonal to each other, compared with the case where the amplitude values with fixed sign obtained from the I baseband signal and the Q baseband signal, which are orthogonal to each other, are rounded off.

Further, the mobile terminal test device 2 according to the present embodiment can measure the EVM of the measurement point 30 by converting the amplitude value of the I symbol data and the Q symbol data that have been rounded-to-even to the measurement point 30 normalized in accordance with the ideal point 31 on the constellation.

EXPLANATION OF REFERENCE NUMERALS 1, 2 Mobile Terminal Test Device
11 Frequency Conversion Unit
12 A/D Converter
13 Orthogonal Demodulator
14 First Shift Unit
15 First Rounding Unit
16 First Averaging Unit
17 First Signal Processing Unit
18 Display Unit
19 Operation Unit
20 Control Unit
21 Constellation Calculation Unit
22 Second Shift Unit
23 Second Rounding Unit
24 Second Averaging Unit
25 Normalization Factor Calculation Unit
26 Normalization Unit
27 EVM Average Value Calculation Unit
30 Measurement Point
31 Ideal Point
32 Error Vector
100 DUT

What is claimed is:

1. A mobile terminal test device, comprising:
a frequency conversion unit that converts frequency of an analog signal to be measured;
an A/D converter that samples the signal to be measured which has been converted frequency by the frequency conversion unit, and converts the sampled signal to be measured into a binary digital data having a predetermined number of bits;
an orthogonal demodulator that orthogonal-demodulates the digital data outputted from the A/D converter and generates an I baseband signal and a Q baseband signal that are orthogonal to each other;
a shift unit that shifts a numerical information of the I baseband signal and a numerical information of the Q baseband signal in a lower direction by a predetermined number of bits so that the predetermined number of lower bits have a value after a decimal point;
a rounding unit that rounds-to-even the numerical information of the I baseband signal and the numerical information of the Q baseband signal shifted by the shift unit to with a rounding width of 1 in decimal notation; and
an averaging unit that respectively calculates a time average of the numerical information of the I baseband signal and the numerical information of the Q baseband signal rounded by the rounding unit.

2. The mobile terminal test device according to claim 1, wherein
the numerical information of the I baseband signal is an amplitude value of the I baseband signal,
the numerical information of the Q baseband signal is an amplitude value of the Q baseband signal,
the shift unit shifts the amplitude value of the I baseband signal and the amplitude value of the Q baseband signal in a lower direction by a predetermined number of bits so that the predetermined number of lower bits have a value after a decimal point.

3. The mobile terminal test device according to claim 2, further comprising
a first signal processing unit that, when the signal to be measured is a signal based on the time division duplex system, performs signal processing for extracting the time average values in the non-transmission time of the time division duplex system from among the time average values calculated by the averaging unit.

4. The mobile terminal test device according to claim 1, wherein
the signal to be measured is an analog modulation signal,
the numerical information of the I baseband signal is an amplitude value of an I symbol data,
the numerical information of the Q baseband signal is an amplitude value of a Q symbol data,
the mobile terminal test device further comprises a constellation calculation unit that calculates the I symbol data and the Q symbol data for expressing the I baseband signal and the Q baseband signal as a constellation on an IQ plane, per each modulation symbol of the signal to be measured,
the shift unit shifts the amplitude values of the I symbol data and the Q symbol data corresponding to each of the modulation symbols on the constellation in lower direction by the predetermined number of bits so that the predetermined number of lower bits have a value after a decimal point.

5. The mobile terminal test device according to claim 4, further comprising:
a normalization factor calculation unit that calculates a normalization factor for converting the amplitude value of the I symbol data and the amplitude value of the Q symbol data rounded by the rounding unit to measurement points on the constellation, using the time average value calculated by the averaging unit;
a normalization unit that calculates the measurement points on the constellation by normalizing the amplitude value of the I symbol data and the amplitude value of the Q symbol data rounded by the rounding unit, by the normalization factor calculated by the normalization factor calculation unit; and
an EVM average value calculation unit that calculates an absolute value of an amplitude of an error vector between an ideal point on the constellation and a measurement point obtained by the normalization unit and calculates a time average value of the absolute value.

6. A mobile terminal test method, comprising:
a frequency conversion step to convert frequency of an analog signal to be measured;
an A/D conversion step to sample the signal to be measured which has been converted frequency by the frequency conversion step, and convert the sampled signal to be measured into a binary digital data having a predetermined number of bits;
an orthogonal demodulation step to orthogonal-demodulate the digital data outputted from the A/D conversion step and generate an I baseband signal and a Q baseband signal that are orthogonal to each other;
a shift step to shift a numerical information of the I baseband signal and a numerical information of the Q baseband signal in a lower direction by a predetermined number of bits so that the predetermined number of lower bits thereof have a value after a decimal point;

a rounding step to round-to even the numerical information of the I baseband signal and the numerical information of the Q baseband signal shifted by the shift step with a rounding width of 1 in decimal notation; and an averaging step to respectively calculate a time average of the numerical information of the I baseband signal and the numerical information of the Q baseband signal rounded by the rounding step.

7. The mobile terminal test method according to claim 6, wherein the numerical information of the I baseband signal is an amplitude value of the I baseband signal, the numerical information of the Q baseband signal is an amplitude value of the Q baseband signal.

8. The mobile terminal test method according to claim 6, wherein the signal to be measured is an analog modulation signal, the numerical information of the I baseband signal is an amplitude value of an I symbol data of the I baseband signal, the numerical information of the Q baseband signal is an amplitude value of a Q symbol data of the Q baseband signal, the mobile terminal test method further comprises a constellation calculation step to calculate the I symbol data and the Q symbol data for expressing the I baseband signal and the Q baseband signal as a constellation on an IQ plane, per each modulation symbol of the signal to be measured.

9. The mobile terminal test device according to claim 8, further comprising: a normalization factor calculation step to calculate a normalization factor for converting the amplitude value of the I symbol data and the amplitude value of the Q symbol data rounded by the rounding step to measurement points on the constellation, using the time average value calculated by the averaging step;

a normalization step to calculate the measurement points on the constellation by normalizing the amplitude value of the I symbol data and the amplitude value of the Q symbol data rounded by the rounding step, by the normalization factor calculated by the normalization factor calculation step; and an EVM average value calculation step to calculate an absolute value of an amplitude of an error vector between an ideal point on the constellation and a measurement point obtained by the normalization step and calculate a time average value of the absolute value.

* * * * *